United States Patent
Gruhlke et al.

(10) Patent No.: US 7,315,352 B2
(45) Date of Patent: Jan. 1, 2008

(54) OFFNER IMAGING SYSTEM WITH REDUCED-DIAMETER REFLECTORS

(75) Inventors: Russell W. Gruhlke, Fort Collins, CO (US); Rene P. Helbing, Palo Alto, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 226 days.

(21) Appl. No.: 11/088,403

(22) Filed: Mar. 24, 2005

(65) Prior Publication Data

US 2006/0044528 A1    Mar. 2, 2006

Related U.S. Application Data

(63) Continuation-in-part of application No. 10/933,170, filed on Sep. 2, 2004, now Pat. No. 7,173,686.

(51) Int. Cl.
*G03B 27/54* (2006.01)

(52) U.S. Cl. ............................. 355/67; 355/71; 378/34

(58) Field of Classification Search ............ 355/67, 355/71
See application file for complete search history.

(56) References Cited

U.S. PATENT DOCUMENTS

| 3,748,015 | A | * | 7/1973 | Offner ..................... 359/366 |
| 5,512,759 | A | * | 4/1996 | Sweatt .................... 255/492.1 |
| 5,537,385 | A |   | 7/1996 | Alon et al. |
| 6,947,199 | B2 | * | 9/2005 | Roxlo et al. .............. 359/291 |
| 7,130,020 | B2 | * | 10/2006 | Whitney ................... 355/53 |
| 2003/0007066 | A1 |  | 1/2003 | Forrer et al. |

FOREIGN PATENT DOCUMENTS

| GB | 2 332 533 A | 6/1999 |
| WO | WO92/02838 | 2/1992 |

* cited by examiner

*Primary Examiner*—D. Rutledge

(57) ABSTRACT

A projection optical system for digital lithography. The system includes an Offner imaging system defining an optical axis and having a well-corrected region. The system also includes spatial light modulators circumferentially arranged about the optical axis, such that optical beams emitted thereby propagate through the Offner imaging system within the well-corrected region.

17 Claims, 12 Drawing Sheets

OFFNER IMAGING SYSTEM WITH REDUCED-DIAMETER REFLECTORS

This is a continuation-in-part application of application Ser. No. 10/933,170 filed on Sep. 2, 2004, the entirety of which is incorporated by reference.

BACKGROUND OF THE INVENTION

Lithographic imaging systems are high precision, high cost optical systems. As the critical dimensions of the lithographic systems are decreasing, the imaging systems are subject to pressure to improve the accuracy of the images they form. Some lithographic imaging systems employ image correction to reduce errors in images they form. However, lithographic imaging systems with image correction are complex and difficult to align and to maintain in alignment. These complex systems are often subject to misalignment due to environmental thermal changes so that the imaging equipment must be maintained in a thermally stable environment.

FIG. 1 is a cross-sectional schematic side view of an Offner imaging system used in present day lithographic systems. The Offner imaging system 10 is a concentric imaging system having a primary mirror 12 and a secondary mirror 14. The primary mirror 12 has a concave spherical surface 13. The secondary mirror 14 has a convex spherical surface 15. The radius of curvature of the convex spherical surface 15 is about half the radius of curvature of the concave spherical surface 13. The convex spherical surface 15 and the concave spherical surface 13 have centers of curvatures positioned at about the same point 17 indicated by an X on the optical axis 16 shared by the primary mirror 12 and the secondary mirror 14.

In operation, an optical beam 21 propagating from object 18 located at the object plane 26 is directed towards primary mirror 12. Object 18 may be a spatial light modulator or other photolithographic reticle. The optical beam 21 is sequentially reflected by the concave spherical surface 13, the convex spherical surface 15 and the concave spherical surface 13. The second reflection by the concave spherical surface 13 directs the optical beam 21 out of the Offner imaging system 10.

The Offner imaging system 10 is a one-to-one imaging system and has an object plane 26 and an image plane 27. The Offner imaging system 10 forms a real inverted image 19 of an object 18 at an image plane 27 spatially removed from the object plane 26.

Reflection of the optical beam 21 by concave spherical surface 13 and convex spherical surface 15 produces no chromatic aberration. If the radius of curvature of the secondary mirror 14 is half that of the primary mirror 12, all $3^{rd}$ order Seidel aberrations such as spherical, astigmatism, coma, field curvature and distortion are zero in the image plane 27. However, higher order astigmatism is problematic. Increasing the radius of curvature of the secondary mirror 15 from the 2:1 ratio with the radius of curvature of primary mirror 12 introduces some $3^{rd}$ order astigmatism that cancels with the higher order astigmatism in a narrow annular region of the image plane 27. Any image formed within this annular region is well corrected. Unfortunately, the well-corrected region is a relatively small region of the image plane 27.

Rays that strike the center of the secondary mirror 14 are called chief or principal rays for the Offner imaging system 10. These principal rays propagate parallel to the optical axis 16 when entering or exiting the Offner imaging system 10. Each principal ray is the central ray of a bundle of rays propagating from the object plane 26 towards the image plane 27. Since the principal rays propagate parallel the optical axis 16, the region of the image side of the projection optical system 10 through which the principal rays propagate is within the well-corrected image region of Offner imaging system 10. Thus, the image 19 in the image plane 27 is well-corrected. Likewise, the region of the object side of the projection optical system 10 from which principal rays propagate is within the well-corrected object region of Offner imaging system 10 if the object 18 is located in the object plane 26.

The object plane 26 and the image plane 27 are equidistant from the point where optical beam 21 is incident on the convex spherical surface 15. If object 18 is moved towards or away from the concave spherical surface 13 on the optical path of the principal ray entering the Offner imaging system 10, the image 19 formed in an image plane 27 is moved an equal distance towards or away from, respectively, the concave spherical surface 13 on the optical path of the principal ray exiting the Offner imaging system 10.

A spatial light modulator located in the object plane 26 is imaged in a one-to-one dimensional relationship on a workpiece. The workpiece may be, for example, a wafer located at the image plane 27.

Some digital photolithography systems use a reticle that is dynamic, not fixed. In such systems, light is reflected at, transmitted through or emitted from a spatial light modulator located in the object plane 26. The spatial light modulator has a high aspect ratio. The aspect ratio of the spatial light modulator is the ratio of the length to the width of the spatial light modulator. A high aspect ratio is a ratio of more than 5:1. A typical spatial light modulator for a digital lithography system has dimensions of 75 mm to 1 mm for a 75:1 aspect ratio. To fit the complete image of the spatial light modulator within the well-corrected annular region of the image plane 27 requires that the diameter of the primary mirror 12 be large. For a 1 mm by 75 mm reticle image to be within the well-corrected annular region of the primary mirror 12, the diameter of the primary mirror would be about 651 mm. A concave mirror of this size is very expensive.

A projection optical system for digital lithography is described in U.S. patent application Ser. No. 10/933,170 of Russell W. Gruhlke, et al. entitled *Offner Imaging System with Reduced-Diameter Reflectors* filed on Sep. 2, 2004. In patent application Ser. No. 10/933,170, the projection optical system includes an Offner imaging system defining an optical axis and having a well-corrected region and means for shaping an optical beam having an extent too large to fit within the well-corrected region to propagate through the Offner imaging system within the well-corrected region.

What is needed is a way to reduce the diameter of the primary mirror 12 in an optical imaging system for digital lithography capable of imaging low or medium aspect ratio reticles within the well-corrected region.

SUMMARY OF THE INVENTION

One aspect of the present invention provides a projection optical system for digital lithography. The system includes an Offner imaging system defining an optical axis and having a well-corrected region. The system also includes spatial light modulators circumferentially arranged about the optical axis, such that optical beams emitted thereby propagate through the Offner imaging system within the well-corrected region.

Another aspect of the present invention provides a projection optical system for digital lithography. The system includes an Offner imaging system defining an optical axis and having a well-corrected region, spatial light modulators circumferentially arranged about the optical axis, and means for directing optical beams emitted from spatial light modulators to propagate through the Offner imaging system within the well-corrected region.

Another aspect of the present invention provides a method of imaging spatial light modulators. The method includes providing an Offner imaging system defining an optical axis and having a well-corrected region, arranging spatial light modulators circumferentially about the optical axis, and emitting optical beams from the spatial light modulators. The optical beams have extents that fit within the well-corrected region so that the emitted optical beams propagate through the Offner imaging system within the well-corrected region.

BRIEF DESCRIPTION OF THE DRAWINGS

The present invention is illustrated by way of example and not limitation in the accompanying figures, in which like references indicate similar elements, and in which.

DETAILED DESCRIPTION

The present patent application describes a projection optical system for digital lithography for use with spatial light modulators or other photolithographic reticles each having a medium or low aspect ratio. In the present patent application, the emitted optical beams have extents small enough to fit within the well-corrected region of an Offner Imaging system.

Figure 2:
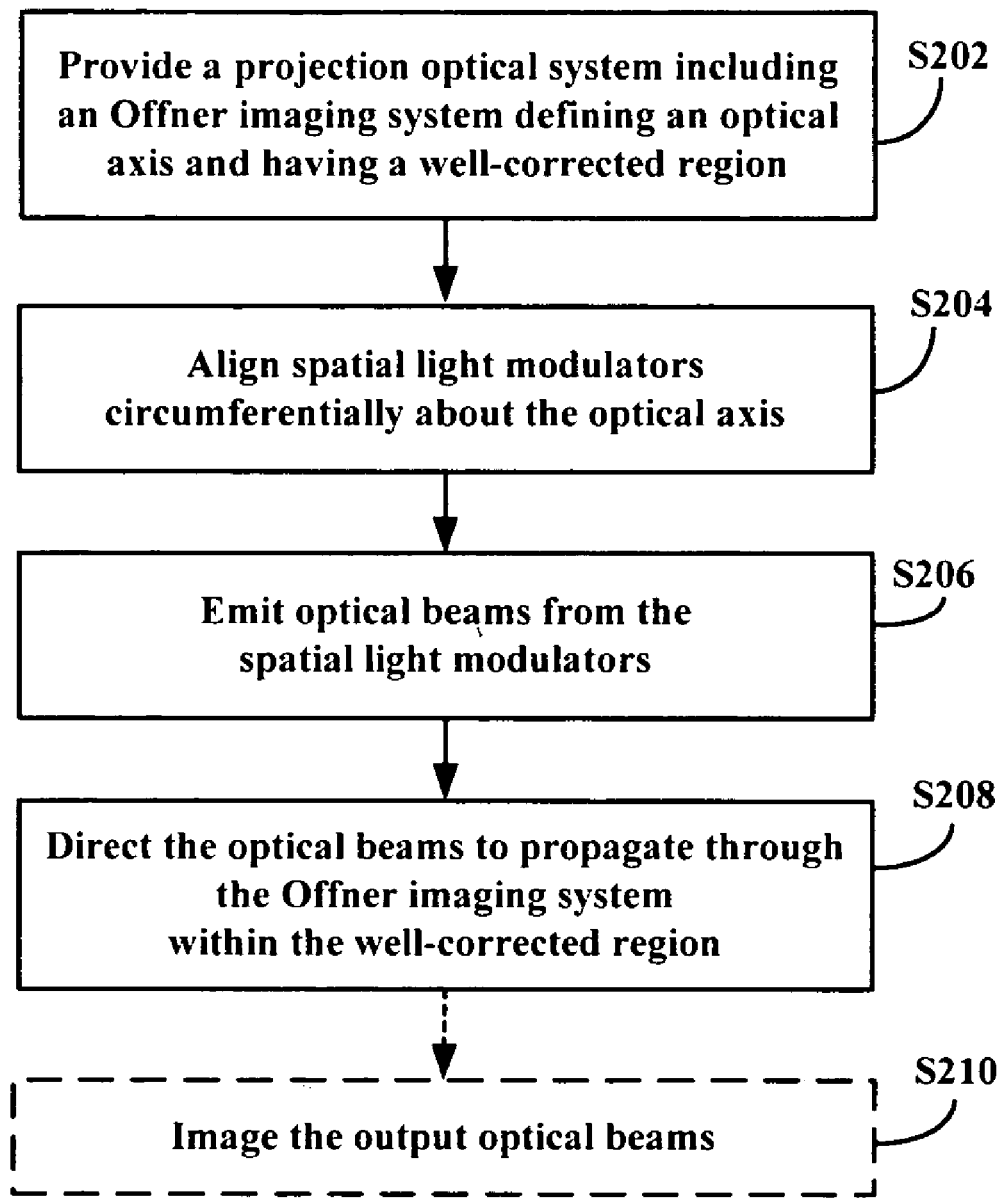
FIG. 2 is a flow chart illustrating a method of imaging a spatial light modulator in accordance with the invention.

FIG. 2 is a flow chart 200 illustrating a method of imaging a spatial light modulator in accordance with the invention. The method includes, providing an Offner imaging system 10 with a well corrected region; circumferentially aligning spatial light modulators about the optical axis of the Offner imaging region 10; emitting optical beams from the spatial light modulators that have extents that fit within the well corrected region. The emitted optical beams are directed to propagate through the Offner imaging system 10 within the well-corrected region.

Figure 1:
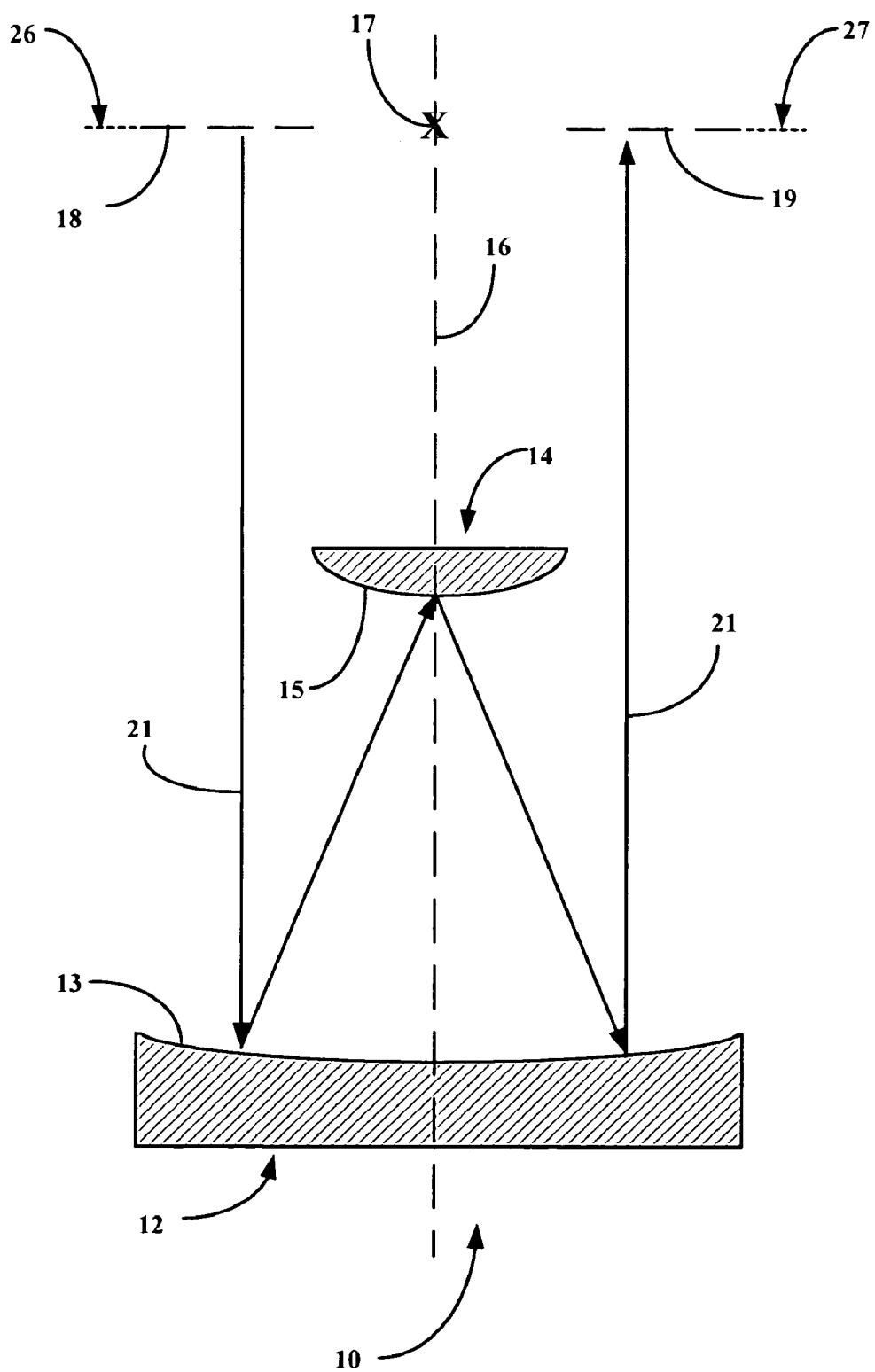
FIG. 1 is a cross-sectional view of an example of a conventional Offner imaging system.

The method just described will now be described in more detail with additional reference to FIGS. 3 and 4. During stage S202, a projection optical system including an Offner imaging system 10 is provided. The Offner imaging system 10 defines an optical axis 16 and has a well-corrected region as described above with reference to FIG. 1.

During stage S204, spatial light modulators are circumferentially aligned about the optical axis 16 of the Offner imaging system 10. For a spatial light modulator to be circumferentially aligned about the optical axis 16, the direction of propagation of the central ray of the emitted optical beam, when projected onto a plane perpendicular to the optical axis 16, is parallel to the radius of the primary mirror 12. An exemplary radius of the primary mirror 12 is shown as R in FIG. 3.

Figure 3:
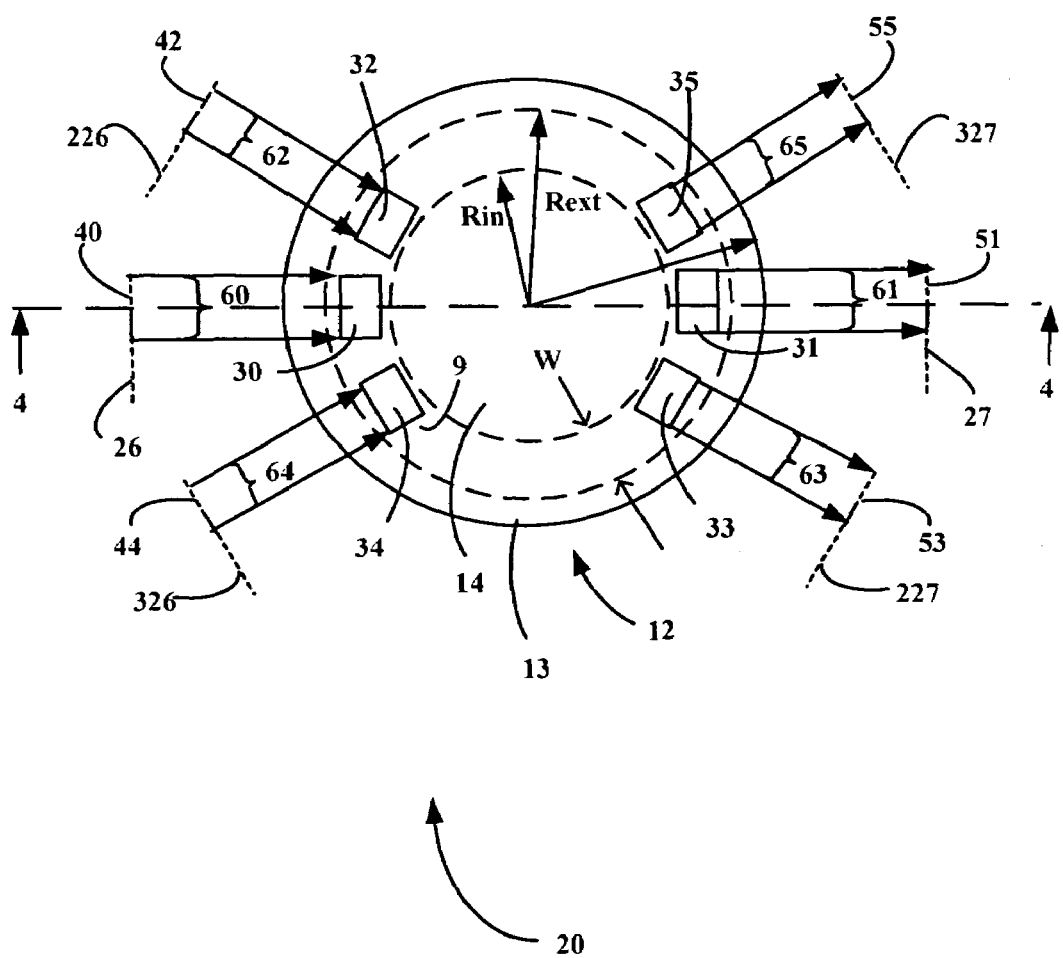
FIGS. 3 and 4 are, respectively, a top view and a cross-sectional view of an example of a first embodiment of a projection optical system for digital lithography in accordance with the invention.
Figure 10:
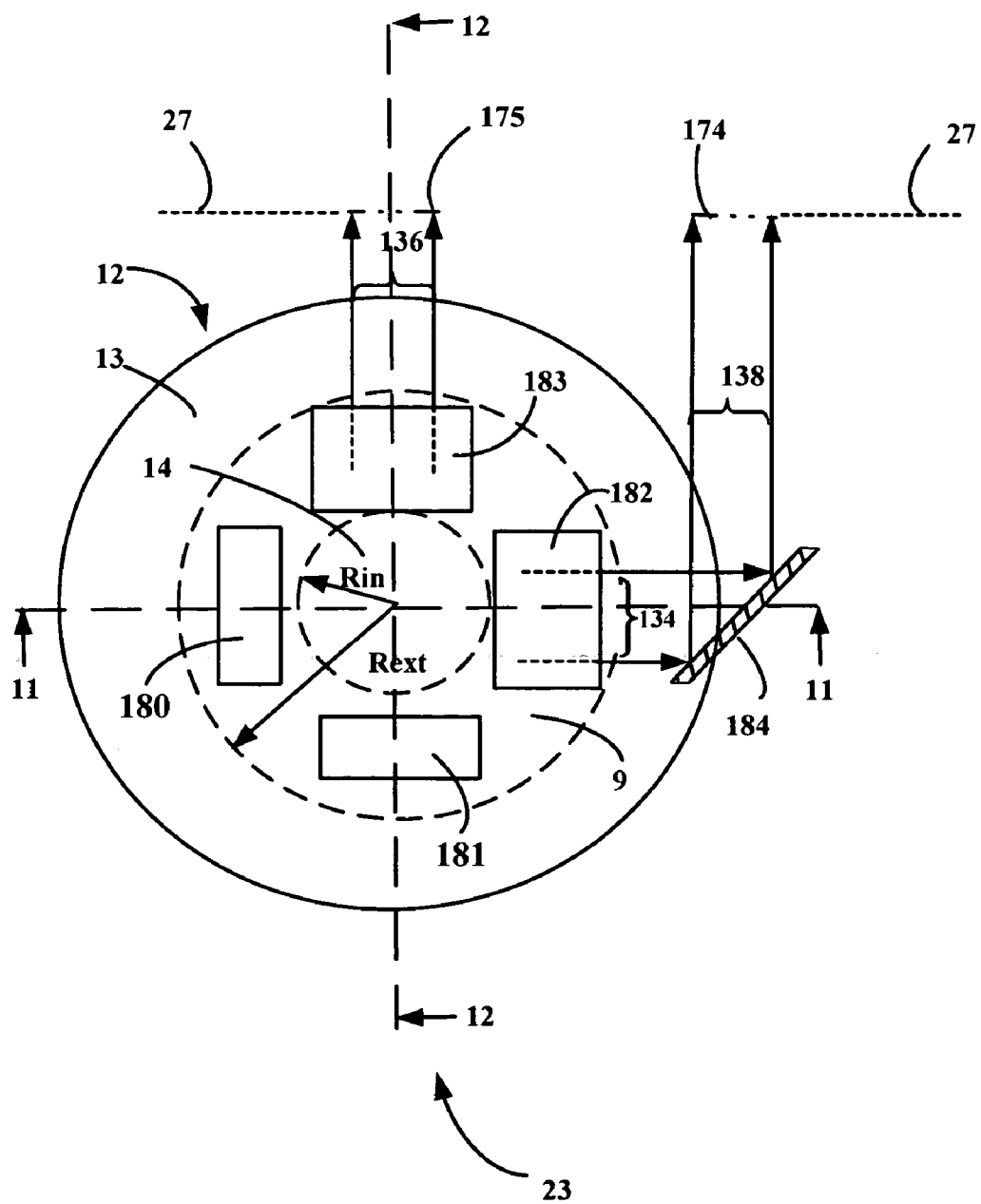
FIGS. 10-12 are, respectively, a top view, a first cross-sectional view and a second cross-sectional view of an example of a fourth embodiment of a projection optical system for digital lithography in accordance with the invention.
Figure 11:
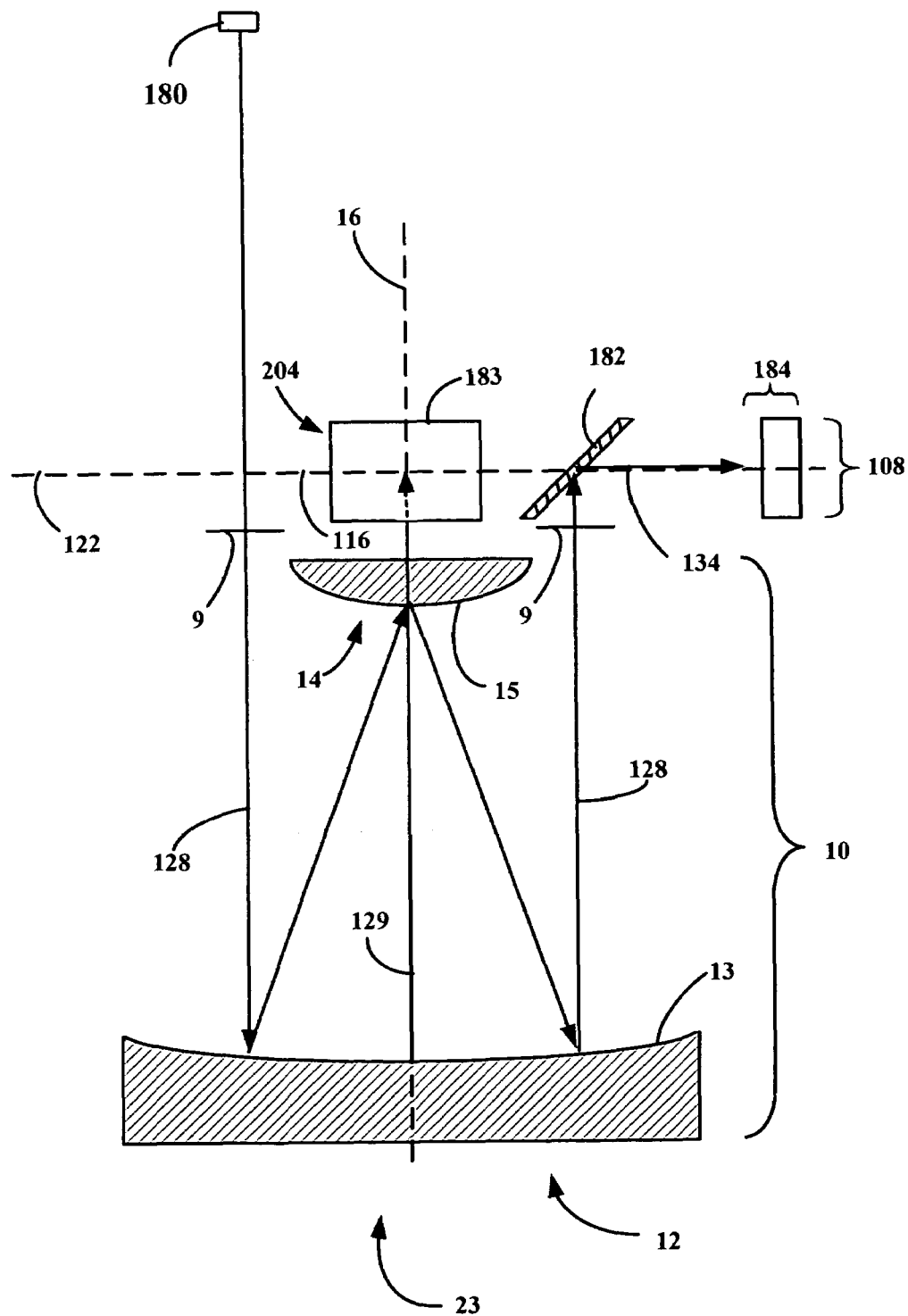

In one embodiment, the spatial light modulators are arranged such that each emitted optical beam propagates parallel to the radius of the primary mirror, as illustrated by optical beam 60 in FIG. 3. In another embodiment, the spatial light modulator emits an optical beam towards the concave spherical surface 13 of primary mirror 12, as illustrated in FIGS. 10-11 by spatial light modulator 180. In this embodiment, the emitted optical beam has an extent in a length direction that is parallel to a tangent of the primary mirror 12. A light source and reticle can replace the spatial light modulator and, as used in this discussion, the term spatial light modulator will be understood to encompass such an arrangement.

Figure 4:
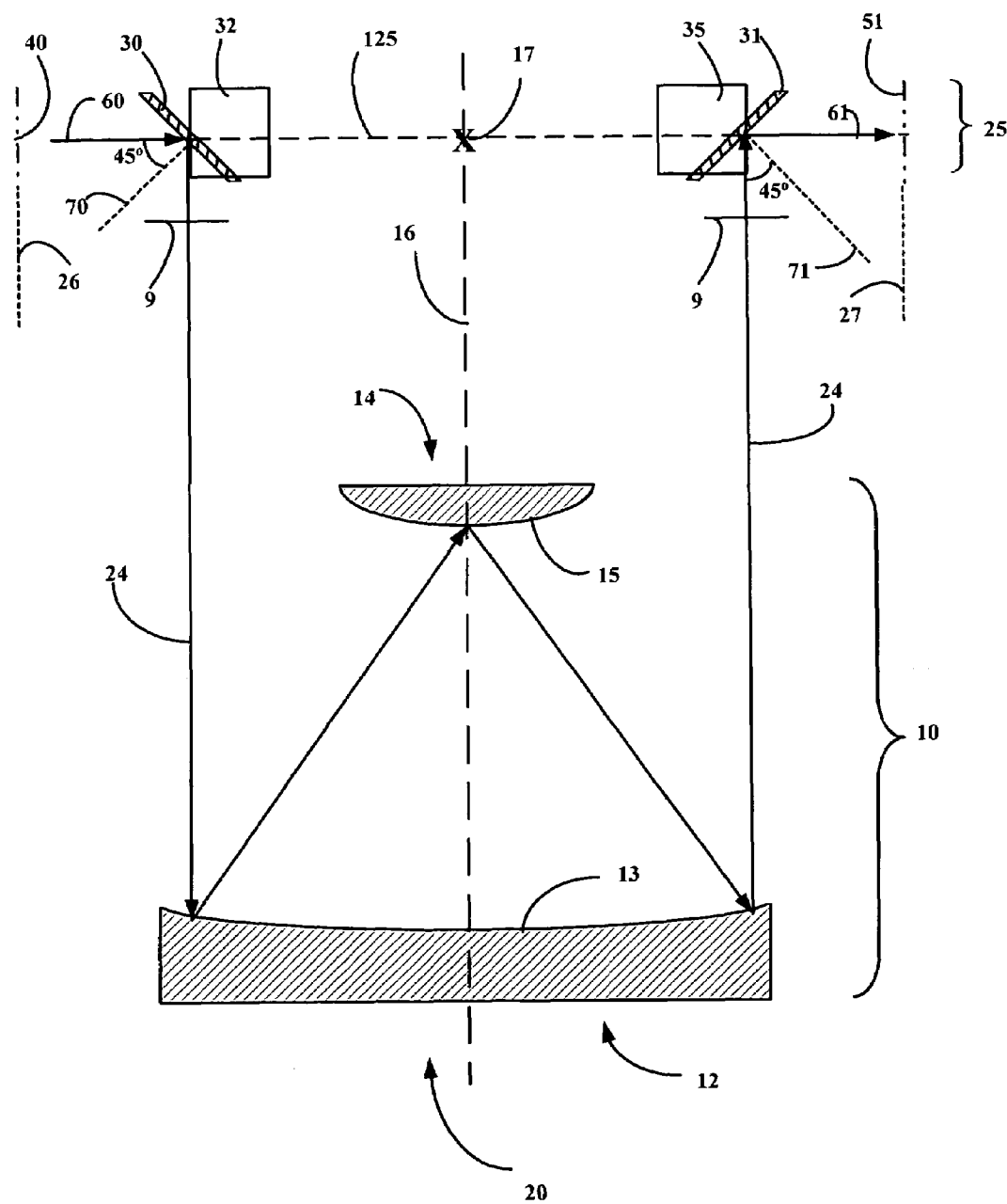

Referring to FIGS. 3 and 4, the spatial light modulators are each located at an object plane 26 of the Offner imaging system 10 and can each have a unique object or light pattern to be imaged at the image plane 27. The extent of each of the emitted optical beams fits within the well-corrected region of Offner imaging system 10. In one embodiment, the spatial light modulators are low aspect ratio spatial light modulators. The aspect ratio of the spatial light modulator is the ratio of the length to the width of the spatial light modulator. A low aspect ratio is a ratio of less than 2:1. In another embodiment, the spatial light modulators are medium aspect ratio spatial light modulators. A medium aspect ratio is a ratio of less than 4:1 and more than 2:1. In yet another embodiment, the spatial light modulators are either low aspect ratio spatial light modulators or medium aspect ratio spatial light modulators.

During stage S206, optical beams are emitted from the spatial light modulators circumferentially aligned about the optical axis 16 of the Offner imaging system 10. In one embodiment, the optical beams from one or more of the spatial light modulators are partially coherent beams. In another embodiment, the optical beams from one or more of the spatial light modulators are non-coherent beams. In another embodiment, the projection optical system includes one or more collimators arranged to collimate the optical beams emitted from one or more spatial light modulators.

During stage S208, the optical beams are directed to propagate through the Offner imaging system 10 within the well-corrected region.

Stage S210 is optional. During stage S210, the output optical beams are imaged in the image planes of the projection optical system. In one embodiment, the respective image planes of the spatial light modulators are separate image planes. In another embodiment, the image planes for each spatial light modulator are in a common image plane.

FIGS. 3 and 4 are, respectively, a top view and a cross-sectional view of an example of a first embodiment of a projection optical system 20 for digital lithography in accordance with the invention. FIGS. 3 and 4 show the spatial light modulators 40, 42 and 44 emitting optical beams 60, 62 and 64, which are directed by respective pairs of folding mirrors 30-35 into the well-corrected region 9 of the Offner imaging system 10. Output beams 61, 63 and 65 are imaged in different image planes as respective images 51, 53 and 55. FIG. 4 shows a cross-sectional view of one pair of folding mirrors 30-31 in the projection optical system 20. A cross-sectional view of pair of folding mirrors 32-33 or pair of folding mirrors 34-35 would look the same as FIG. 4.

The plane upon which the cross-section view of FIG. 4 is taken is indicated by section line 4-4 in FIG. 3. Projection optical system 20 is composed of the Offner imaging system 10 and mirror segments 25. The Offner imaging system 10, as described above with reference to FIG. 1, includes a primary mirror 12 and a secondary mirror 14 and a well-corrected region 9. Optical beams that strike the center of the secondary mirror 14 are the principal rays for the Offner imaging system 10. These principal rays propagate parallel to the optical axis 16 when entering or exiting the Offner imaging system 10, as described above with reference to FIG. 1. Optical beam 24 (FIG. 4) is the central ray of a bundle of rays propagating from the object plane 26 towards the image plane 27. Since the optical beam 24 propagates parallel to the optical axis 16, the region of the image side of the projection optical system 20 through which the principal rays propagate is within the well-corrected image region 9 of Offner imaging system 10. Thus, the image 51 in the image plane 27 is in the well-corrected region 9. Likewise, the region of the object side of the projection optical system 20 from which optical beams 24 propagate is within the well-corrected object region 9 of Offner imaging system 10 if the spatial light modulator 40 is located in the object plane 26.

The optical path indicated by the principal rays is within the well-corrected region 9 of the projection optical system 20. The well-corrected region 9 parallel to the optical axis 16 and between mirror segments 25 and the primary mirror 12 has an annular shape.

The spatial light modulators 40, 42 and 44 are circumferentially aligned about the optical axis and emit optical beams 60, 62 and 64, respectively. The optical beams 60, 62 and 64 have extents that fit within the well-corrected region 9 of the Offner imaging system 10. In one embodiment, the spatial light modulators 40, 42 and 43 are low aspect ratio spatial light modulators. In another embodiment, the spatial light modulators 40, 42 and 44 are medium aspect ratio spatial light modulators. In yet another embodiment, the spatial light modulators 40, 42 and 43 are either low aspect ratio spatial light modulators or medium aspect ratio spatial light modulators.

The mirror segments 25 include six folding mirrors 30-35, which form three pairs of folding mirrors 30-31, 32-33, and 34-35. The folding mirrors 30-35 are plane mirrors. The folding mirrors 30-35 are positioned in a plane 125, shown in cross-section as the line indicated as 125 in FIG. 4. The plane 125 is perpendicular to the optical axis 16 and offset along the optical axis 16 from the well-corrected region 9. The folding mirrors 30-35 all point away from the optical axis 16. Plane mirrors 30-35 of mirror segments 25 are aligned with the well-corrected region 9.

Pairs of folding mirrors 30-31, 32-33, and 34-35 are radially aligned about the optical axis 16 circumferentially offset from one another to direct respective optical beams 60, 62, and 64 through the well-corrected region 9. For a plane mirror to be radially aligned about the optical axis 16, a projection of the normal of the plane mirror onto the plane 125 is radially aligned with respect to the optical axis 16.

In one embodiment, collimators (not shown) are arranged to collimate the optical beams 60, 62 and 64 emitted from the respective spatial light modulators 40, 42 and 43. The collimators can be fixed to spatial light modulators 40, 42 and 43 or placed between the spatial light modulators 40, 42 and 43 and respective folding mirrors 30, 32 and 34.

The normal 70 and normal 71 of respective folding mirrors 30 and 31 are shown in FIG. 4 aligned at a 45° angle from plane 125. The normals of mirrors 32-35 are likewise arranged.

First pair of folding mirrors 30-31 performs the directing of an optical beam 60, which has an extent that fits within the well-corrected region 9, so that optical beam 60 is directed as first optical beam 24 to propagate through the Offner imaging system 10 within the well-corrected region 9. Optical beam 60 is emitted from spatial light modulator 40 in object plane 26. Folding mirror 30 is diametrically opposite folding mirror 31. The term "opposite" as used herein encompasses a range of opposing positions, so diametrically opposite components or portions need not be exactly opposite each other. Folding mirrors 30 and 31 have a width equal to or greater than the width of the spatial light modulator 40.

The first optical beam 24 is reflected by the primary mirror 12, the secondary mirror 14 and again by primary mirror 12 of Offner imaging system 10 and emerges from Offner imaging system 10 as output optical beam 61. The second reflection by the concave spherical surface 13 of primary mirror 12 directs the first optical beam 24 towards the folding mirror 31. The optical beam 24 is reflected at the folding mirror 31 towards image plane 27 of the projection optical system 20 as output optical beam 61. A real inverted image 51 of spatial light modulator 40 is formed in the image plane 27.

Second pair of folding mirrors 32-33 performs the directing of an optical beam 62, which has an extent that fits within the well-corrected region 9, so that optical beam 62 is directed as a second optical beam (not shown) to propagate through the Offner imaging system 10 within the well-corrected region 9. Optical beam 62 is emitted from spatial light modulator 42 in object plane 226. Folding mirror 32 is diametrically opposite folding mirror 33. Folding mirrors 32 and 33 have a width equal to or greater than the width of the spatial light modulator 42.

The second optical beam is reflected by the primary mirror 12, the secondary mirror 14 and again by primary mirror 12 of Offner imaging system 10 and emerges from Offner imaging system 10 as second optical beam 63. The second reflection by the concave spherical surface 13 directs the second optical beam towards the folding mirror 33. The second optical beam is reflected at the folding mirror 33 towards image plane 227 of the projection optical system 20 as output optical beam 63. A real inverted image 53 of spatial light modulator 42 is formed in the image plane 227.

Third pair of folding mirrors 34-35 performs the directing of an optical beam 64, which has an extent that fits within the well-corrected region 9, so that optical beam 64 is directed as a third optical beam (not shown) to propagate through the Offner imaging system 10 within the well-corrected region 9. Optical beam 64 is emitted from spatial light modulator 44 in object plane 326. Folding mirror 34 is diametrically opposite folding mirror 35. Folding mirrors 34 and 35 have a width equal to or greater than the width of the spatial light modulator 44.

The third optical beam is reflected by the primary mirror 12, the secondary mirror 14 and again by primary mirror 12 of Offner imaging system 10 and emerges from Offner imaging system 10 as third optical beam 65. The second reflection by the concave spherical surface 13 directs the third optical beam towards the folding mirror 35. The third optical beam is reflected at the folding mirror 35 towards image plane 327 of the projection optical system 20 as output optical beam 65. A real inverted image 55 of spatial light modulator 44 is formed in the image plane 327.

This exemplary first embodiment of a projection optical system 20 includes three pairs of folding mirrors but more than three pairs of folding mirrors or as few as two pairs of folding mirrors can be used. The optical beams are partially coherent or non-coherent optical beams.

A transcendental equation describes the geometrical relationship between the lengths and widths of mirror segments 25 and the radii of the annular well-corrected region 9. The transcendental equation is a function of the width and length of each spatial light modulator 40, 42, 44, 46 and 48, the internal radius, $R_{in}$, of the well-corrected region 9 annulus, external radius, $R_{ext}$, of the well-corrected region 9 annulus and the width of the well-corrected region, W, annulus. Generating the transcendental equation is known in the art.

The images 51, 53 and 55 formed by the projection optical system 20 are distributed circumferentially about the optical axis 16. In this manner, more than one low or medium aspect ratio spatial light modulator is imaged on more than one respective workpiece positioned at the image planes of the projection optical system 21.

In one embodiment, the projection optical system 20 can be used for parallel processing using a single Offner imaging system 10. In this case, the spatial light modulators 44, 40 and 42 emit optical beams 64, 60 and 62 sequentially and the workpiece is moved from one image plane to another in a correlated sequence. For example, the workpiece is first positioned in image plane 327 when spatial light modulator 44 emits optical beam 64. Then, the workpiece is moved to image plane 27 to received optical beam 60 from spatial light modulator 40. In another embodiment, a workpiece having a cylindrical surface, which encompasses image planes 327, 27 and 227, is positioned at the image planes 327, 27 and 227 of the projection optical system 20.

Figure 5:
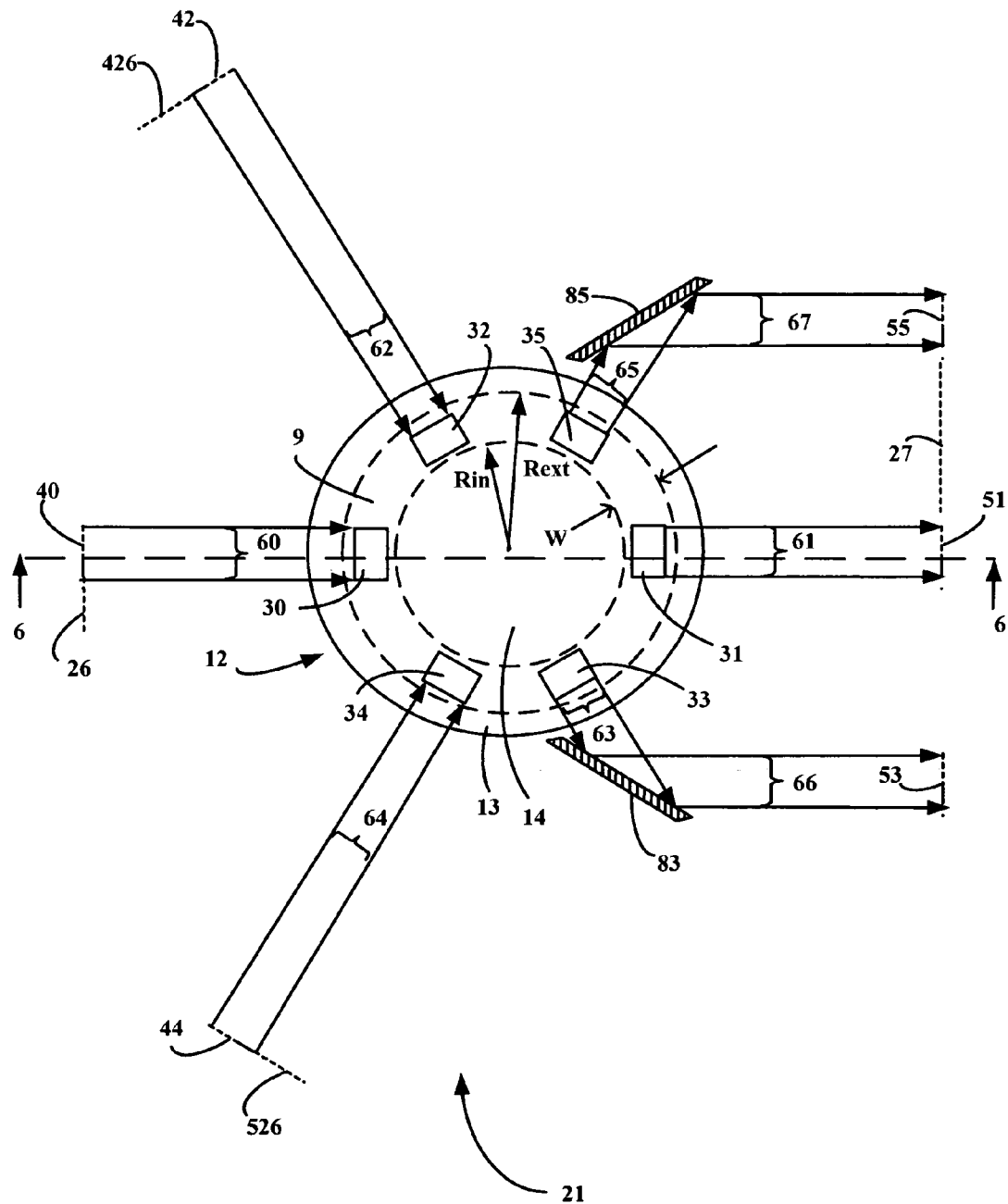
FIGS. 5 and 6 are, respectively, a top view and a cross-sectional view of an example of a second embodiment of a projection optical system for digital lithography in accordance with the invention.
Figure 6:
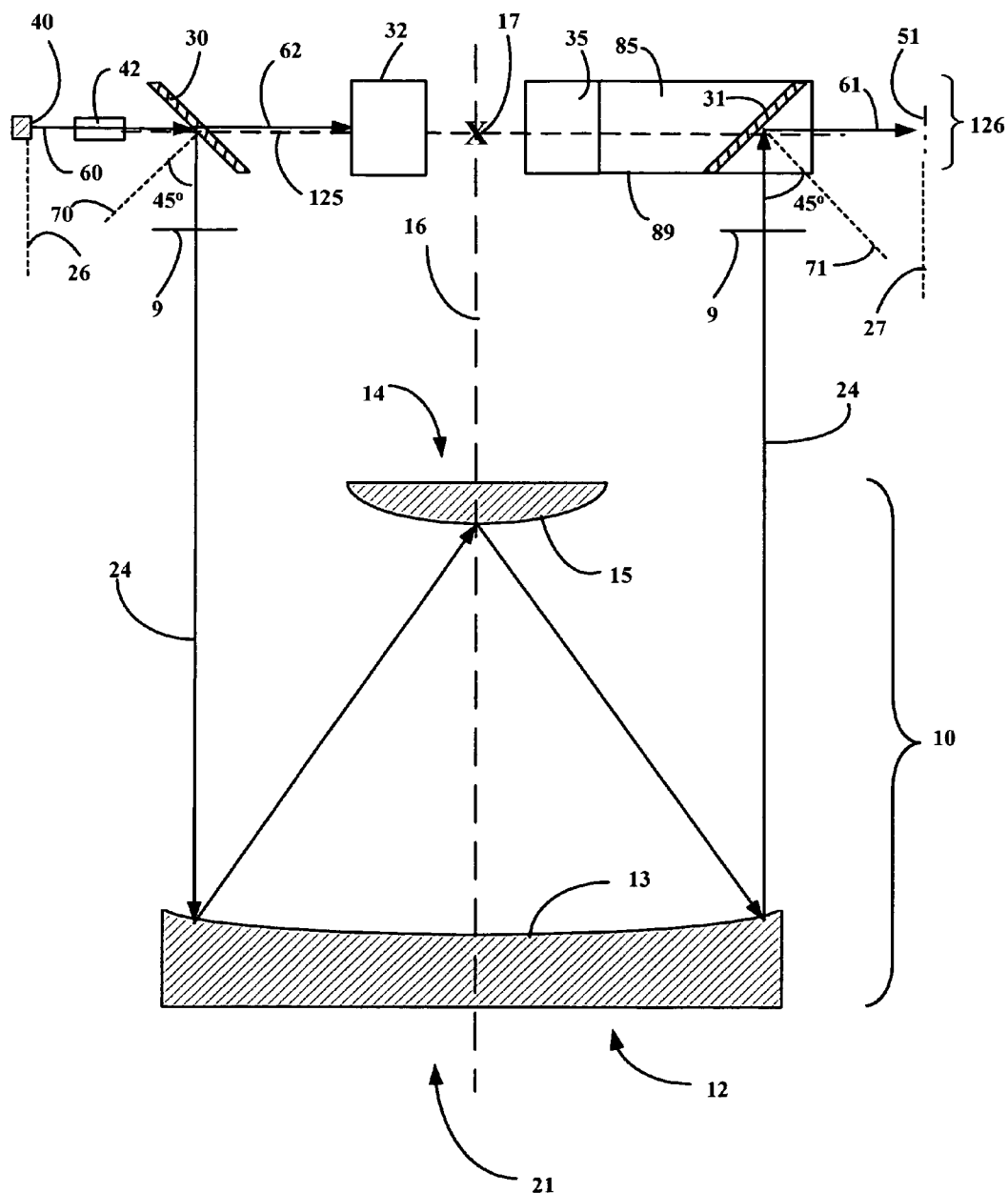

FIGS. 5 and 6 are, respectively, a top view and a cross-sectional view of an example of a second embodiment of a projection optical system 21 for digital lithography in accordance with the invention. FIGS. 5 and 6 show the spatial light modulators 40, 42 and 44 emitting optical beams 60, 62 and 64, which are directed by mirror segments 126 into the well-corrected region 9 of the Offner imaging system 10. Output beams 61, 66 and 67 are imaged in one image plane 27. Projection optical system 21 is suitable for simultaneously imaging more than one low or medium aspect ratio spatial light modulator on a plane workpiece in image plane 27. The plane upon which the cross-section view of FIG. 6 is taken is indicated by section line 6-6 in FIG. 5. FIG. 6 shows a cross-sectional view of mirror segments 126 in the projection optical system 21.

The projection optical system 21 is composed of the Offner imaging system 10 and mirror segments 126. The mirror segments 126 include the six folding mirrors 30-35 and two plane turning mirrors 83 and 85. The function of the folding mirror 30-35 is as described above with reference to projection optical system 20 of FIGS. 3 and 4.

The spatial light modulators 40, 42 and 44 emit optical beams 60, 62 and 64, respectively. Optical beams 60, 62 and 64 are collimated as described above. Otherwise, spatial light modulators 40, 42 and 44 and optical beams 60, 62 and 64 have the same function and characteristics as described above with reference to projection optical system 20 of FIGS. 3 and 4. The relative position of the images 55, 51 and 53 in the image plane 27 is the reverse of the relative positions of the spatial light modulators 42, 40 and 44.

The plane turning mirrors 83 and 85 are positioned to direct the output optical beams 63 and 65, respectively, toward image plane 27. The output optical beams 63 and 65 are reflected at the plane turning mirrors 83 and 85, respectively, towards image plane 27 of the projection optical system 21 as output optical beams 66 and 67, respectively. The output optical beams 61, 66 and 67 form images 51, 53, and 55, respectively in the image plane 27. The plane turning mirrors 83 and 85 each have a width to accept the complete width of output optical beams 63 and 65, respectively, at the angle of incidence required to direct the output optical beams 63 and 65. The width of the plane turning mirrors 83 and 85 must be larger than the width of the spatial light modulators 42 and 44, respectively.

The turning mirrors 83 and 85 add length to the optical path of output optical beams 63 and 65 and change the image locations of images 51, 53 and 55 from the circumferential array shown in FIG. 3 to a planar array in plane 27 shown in FIG. 5. Since the object distance of the spatial light modulator 42 equals the image distance of the image 53, the path length of optical beam 62 equals the optical path of output optical beams 63 and 66. The spatial light modulator 42 is positioned further from the optical axis 16 than spatial light modulator 40. The image 53 is positioned further from the optical axis 16 than image 51 since the optical path of output optical beams 63 and 66 is longer than optical path of output optical beam 61.

Likewise, the object distance of the spatial light modulator 44 equals the image distance of the image 55 so the path length of optical beam 64 equals the optical path of output optical beams 65 and 67. The spatial light modulator 44 is positioned further from the optical axis 16 than spatial light modulator 40. The image 55 is positioned further from the optical axis 16 than image 51 since the optical path of output optical beams 65 and 67 is larger than optical path of output optical beam 61.

In one embodiment, the optical path of output optical beams 65 and 67 equals the optical path of output optical beams 63 and 66.

In this manner, more than one spatial light modulator is imaged on a flat workpiece positioned within the image plane 27 of the projection optical system 21. The combined lengths of the spatial light modulators that intercept the plane 125 are equal to or longer than the length of a single high aspect ratio spatial light modulator that intercepts the plane 125.

Figure 7:
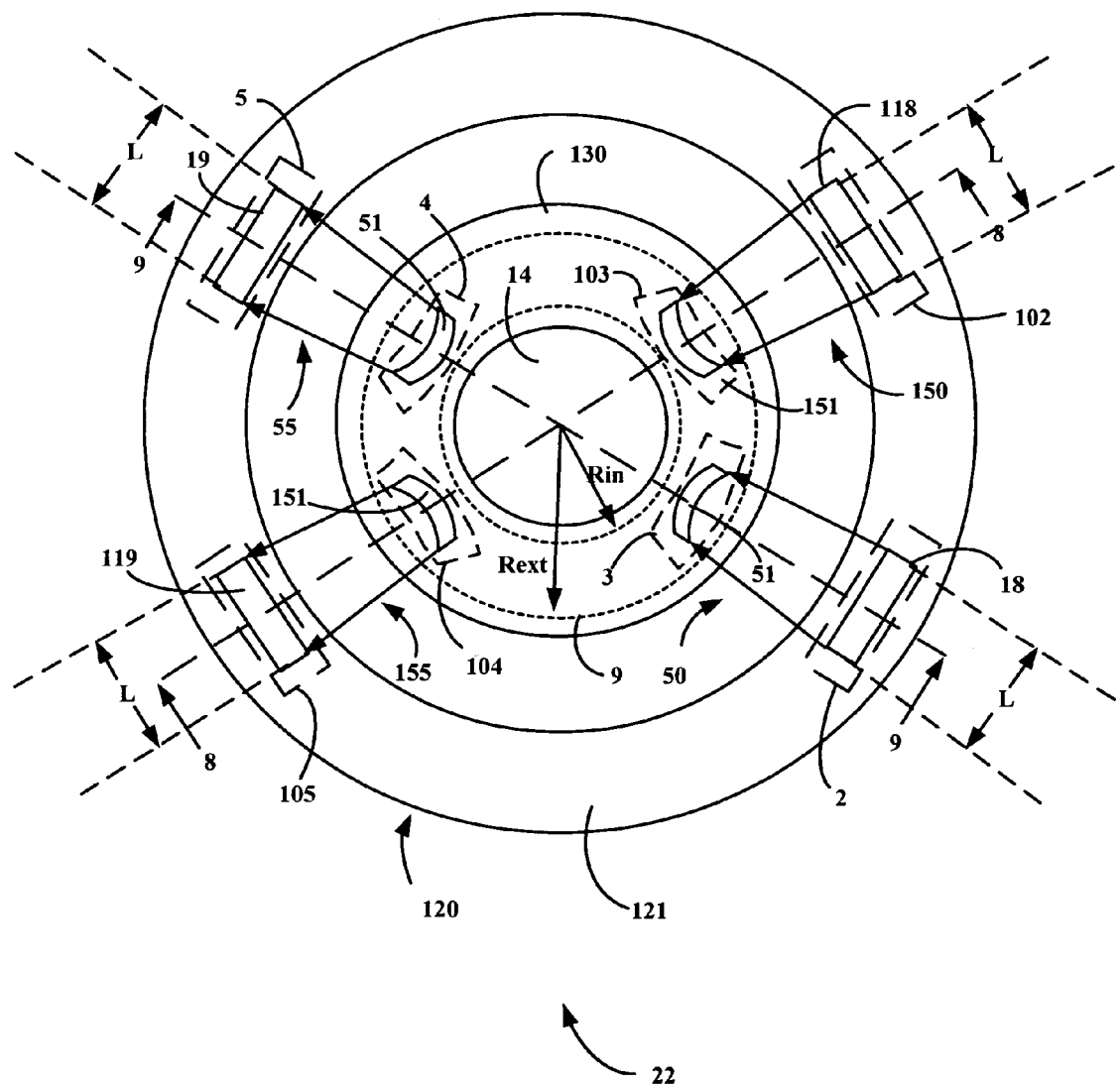
FIGS. 7-9 are, respectively, a top view, a first cross-sectional view and a second cross-sectional view of an example of a third embodiment of a projection optical system for digital lithography in accordance with the invention.
Figure 8:
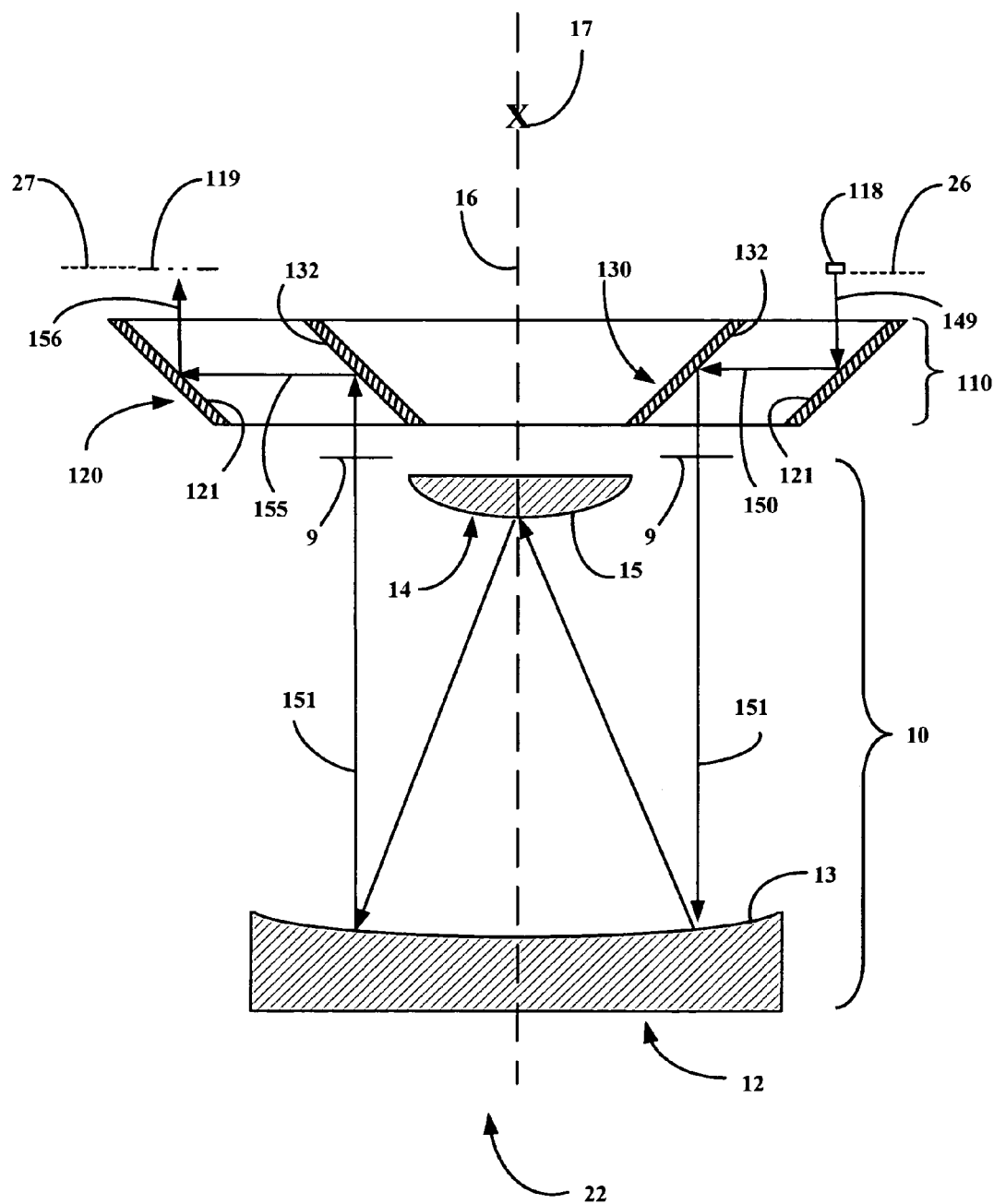
Figure 9:
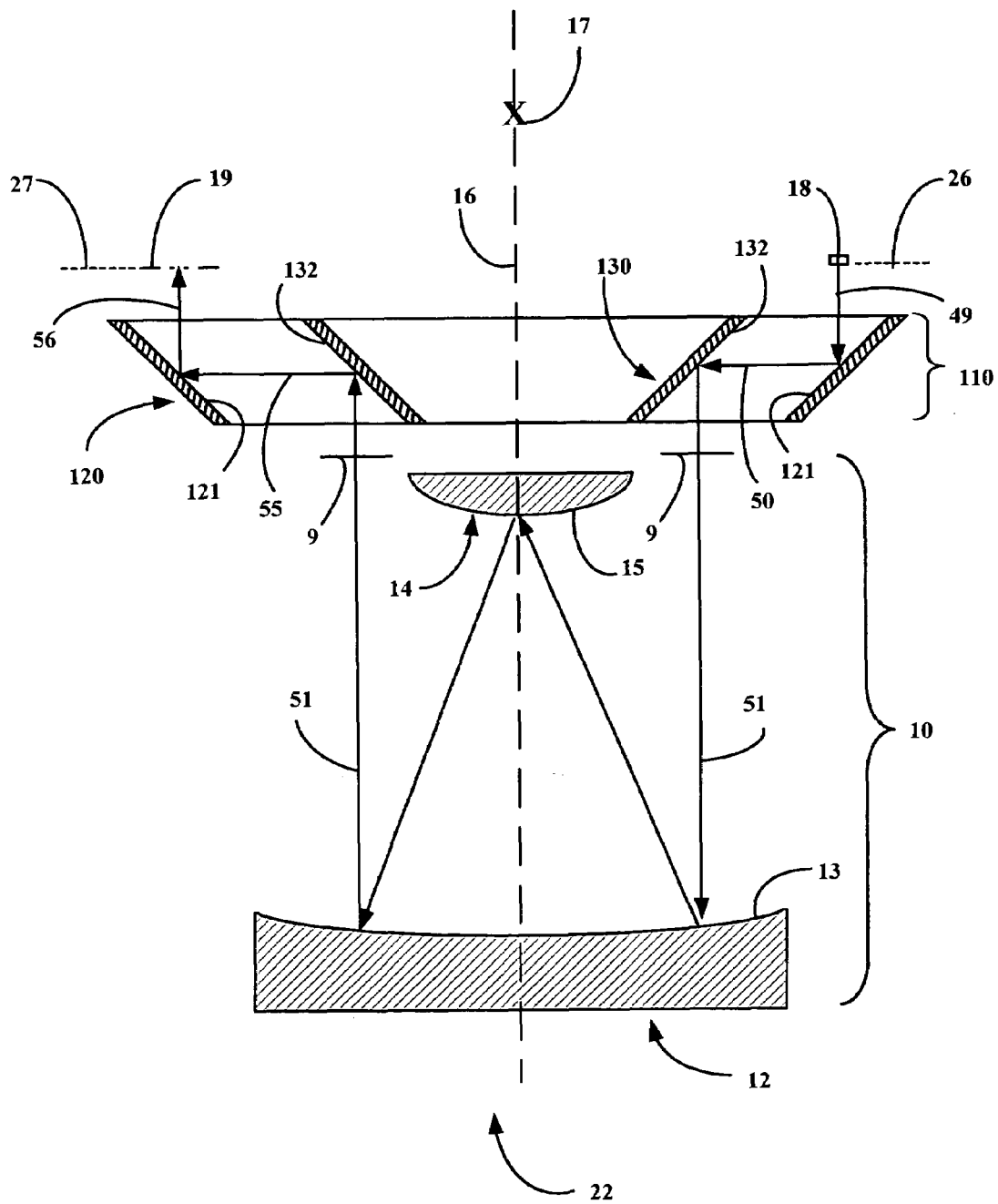

FIGS. 7-9 are, respectively, a top view, a first cross-sectional view and a second cross-sectional view of an example of a third embodiment of a projection optical system 22 for digital lithography in accordance with the invention. FIGS. 7-9 show the spatial light modulators 18 and 118 emitting optical beams 49 and 149, which are directed by mirror system 110 into the well-corrected region 9 of the Offner imaging system 10. Output beams 56 and 156 are imaged in one image plane 27. Projection optical system 22 is suitable for simultaneously imaging more than one low or medium aspect ratio spatial light modulator on a plane workpiece in image plane 27. The plane upon which the first cross-section view of FIG. 8 is taken is indicated by section line 8-8 in FIG. 7. The plane upon which the second cross-section view of FIG. 9 is taken is indicated by section line 9-9 in FIG. 7.

Projection optical system 22 is a concentric imaging system composed of the Offner imaging system 10 and a mirror system 110 (FIG. 8). The Offner imaging system 10, as described above with reference to FIG. 1, includes a primary mirror 12 and a secondary mirror 14. The mirror system 110 is composed of an outer frustoconical reflector 120 having a frustoconical internal reflective surface 121 and an inner frustoconical reflector 130 having a frustoconical external reflective surface 132. The spatial light modulators 18 and 118 are concentrically aligned about the optical axis 16. In one embodiment, spatial light modulators 18 and 118 are located in a common plane that is perpendicular to and offset from the optical axis 16.

The frustoconical internal reflective surface 121 faces the optical axis 16, is concentric with the optical axis 16 and is further from the optical axis 16 than the well-corrected region 9. The frustoconical external reflective surface 132 faces away from the optical axis 16 and is concentric with the optical axis 16. The frustoconical external reflective surface 132 is aligned to direct light reflected by the frustoconical internal reflective surface 121 through the well-corrected region 9.

In FIG. 7, an optical beam is represented by the extreme rays of the optical beam, which will be understandable from the context of the figure and the description. The extent of the annular well-corrected region 9 of Offner imaging system 10 located in the plane between the inner frustoconical reflector 130 and the primary mirror 12 and is represented by broken lines 9 at radii of $R_{ext}$ and $R_{in}$.

Broken lines 3 and 103 fit within the extent of the well-corrected region 9 of the Offner imaging system 10 and represent the extents of first portions 3 and 103 projected onto the well-corrected region 9 of the Offner imaging system 10. Optical beams 50 and 150 are incident on mirror system 110 within first portions 3 and 103, respectively.

Broken lines 4 and 104 fit within the extent of the well-corrected region 9 of the Offner imaging system 10 and represent the extents of second portions 4 and 104 projected onto the well-corrected region 9 of the Offner imaging system 10. Optical beams 51 and 151 are incident on mirror system 110 within respective second portions 4 and 104.

Second portion 104 of frustoconical external reflective surface 132 (FIGS. 8 and 9) is diametrically opposite first portion 103 of frustoconical external reflective surface 132. Second portion 4 of frustoconical external reflective surface 132 is diametrically opposite first portion 3 of frustoconical external reflective surface 132.

Broken lines 2 and 102 represent the extents of first portions 2 and 102. Optical beams 49 and 149 are incident on mirror system 110 within first portions 2 and 102, respectively. Broken lines 5 and 105 represent the extents of second portions 5 and 105. Optical beams 55 and 155 are incident on mirror system 110 within second portions 5 and 105, respectively.

Second portion 105 of frustoconical internal reflective surface 121 is diametrically opposite first portion 102 of frustoconical internal reflective surface 121. Second portion 5 of frustoconical internal reflective surface 121 is diametrically opposite first portion 2 of frustoconical internal reflective surface 121.

The optical beam 149 (FIG. 8) and optical beam 49 (FIG. 9) are not shown in FIG. 7, since they have the same shapes and extents as spatial light modulator 118 and spatial light modulator 18, respectively, and are hidden in FIG. 7 by the spatial light modulator 118 and spatial light modulator 18, respectively. The optical beam 156 (FIG. 8) and optical beam 56 (FIG. 9) are not shown in FIG. 7, since they have the same shapes and extents as images 119 and 19, respectively, and are hidden in FIG. 7 by the images 119 and 19, respectively.

FIGS. 7-9 show an embodiment having two spatial light modulators but more than two spatial light modulators can be used in projection optical system 22.

Referring now to FIG. 8, mirror system 110 directs optical beam 149, which is emitted from spatial light modulator 118 in the object plane 26, to the primary mirror 12. Mirror system 110 additionally directs the optical beam 156 from the Offner imaging system 10 to form a real image 119 of spatial light modulator 118 at an image plane 27 spatially removed from the object plane 26.

Optical beam 149 is emitted from the spatial light modulator 118. The optical beam 149 is partially coherent. In one embodiment, optical beam 149 is non-coherent. In one embodiment, the optical beam 149 is collimated by a collimator fixed to spatial light modulator 118 or placed between the spatial light modulator 118 and first portion 102.

Optical beam 149 is reflected at a first portion 102 (FIG. 7) of frustoconical internal reflective surface 121 towards frustoconical external reflective surface 132 as optical beam 150. The reflection of optical beam 149 at a first portion 102 of frustoconical internal reflective surface 121 performs a directing and shaping of optical beam 149. The shaping includes reducing the circumferential extent of the optical beam 150 reflected from frustoconical internal reflective surface 121.

The optical beam 150 converges as it propagates from frustoconical internal reflective surface 121 to frustoconical external reflective surface 132. Thus, the circumferential extent of the optical beam 150 decreases as it propagates so that optical beam 150 has a circumferential extent of less than the length L of spatial light modulator 118 when it is incident on frustoconical external reflective surface 132. The axial extent of optical beam 150 remains constant as it propagates from frustoconical internal reflective surface 121 towards frustoconical external reflective surface 132. Since the circumferential extent of optical beam 150 is reduced, the spatial light modulator 118 can have a high aspect ratio and optical beam 151 will fit within the well-corrected region 9 of the Offner imaging system 10.

Optical beam 150 is reflected at a first portion 103 (FIG. 7) of frustoconical external reflective surface 132 into the Offner imaging system 10 as optical beam 151.

The mirror system 110 directs the optical beam 151 through the well-corrected region 9. The optical beam 151 is reflected by the primary mirror 12, the secondary mirror 14 and again by primary mirror 12 of Offner imaging system 10 and emerges from Offner imaging system 10 as optical beam 151. The optical beam 151 is incident on a second portion 104 (FIG. 7) of frustoconical external reflective surface 132. Frustoconical external reflective surface 132 reflects optical beam 151 towards a second portion 105 (FIG. 8) of frustoconical internal reflective surface 121 as optical beam 155. Frustoconical internal reflective surface 121 reflects optical beam 155 towards image plane 27 as optical beam 156.

In one embodiment, the spatial light modulator 118 has a medium or low aspect ratio so that the optical beam 149 would fit within the well-corrected region 9 of the Offner imaging system 10. In another embodiment, spatial light modulator 118 has a high aspect ratio so that the optical beam 149 would not fit within the well-corrected region 9, but optical beam 151 does fit within the well-corrected region 9.

Referring now to FIG. 9, mirror system 110 directs optical beam 49 from spatial light modulator 18 in the object plane 26 to the primary mirror 12. Mirror system 110 additionally directs the optical beam 56 from the Offner imaging system 10 to form a real image 19 of spatial light modulator 18 at an image plane 27 spatially removed from the object plane 26.

Optical beam 49 is emitted from the spatial light modulator 18. The optical beam 49 is partially coherent. In one embodiment, optical beam 49 is non-coherent. In one embodiment, the optical beam 49 is collimated by a collimator fixed to spatial light modulator 18 or placed between the spatial light modulator 18 and first portion 2.

Optical beam 49 is reflected at a first portion 2 (FIG. 7) of frustoconical internal reflective surface 121 towards frustoconical external reflective surface 132 as optical beam 50. The reflection of optical beam 49 at a first portion 2 of frustoconical internal reflective surface 121 performs a directing and shaping of optical beam 49. The shaping includes reducing the circumferential extent of the optical beam 50 reflected from frustoconical internal reflective surface 121 as described above with reference to FIG. 8. Since the circumferential extent of optical beam 50 is reduced, the spatial light modulator 18 can have a high aspect ratio and optical beam 51 will fit within the well-corrected region 9 of the Offner imaging system 10.

Optical beam 50 is reflected at a first portion 3 (FIG. 7) of frustoconical external reflective surface 132 into the Offner imaging system 10 as optical beam 51. The mirror system 110 directs the optical beam 51 through the well-corrected region 9. The optical beam 51 is reflected by the primary mirror 12, the secondary mirror 14 and again by primary mirror 12 of Offner imaging system 10 and emerges from Offner imaging system 10 as optical beam 51. The optical beam 51 is incident on a second portion 4 (FIG. 7) of frustoconical external reflective surface 132. Frustoconical external reflective surface 132 reflects optical beam 51 towards a second portion 5 (FIG. 7) of frustoconical internal reflective surface 121 as optical beam 55. Frustoconical internal reflective surface 121 reflects optical beam 55 towards image plane 27 as optical beam 56.

In one embodiment, the spatial light modulator 18 has a medium or low aspect ratio so that the optical beam 49 would within the well-corrected region 9 of the Offner imaging system 10. In another embodiment, the spatial light modulator 18 has a high aspect ratio so that the optical beam 49 would not fit within the well-corrected region 9, but optical beam 51 does fit within the well-corrected region 9.

In one embodiment, the optical beams 49 and 149 are incident on frustoconical internal reflective surface 121 with a 45° angle of incidence, optical beams 50 and 150 are incident on frustoconical external reflective surface 132 with a 45° angle of incidence, optical beams 51 and 151 are incident on frustoconical external reflective surface 132 with a 45° angle of incidence, and optical beams 55 and 155 are incident on frustoconical internal reflective surface 121 with a 45° angle of incidence.

The images 19 and 119 formed by the projection optical system 22 are distributed circumferentially about the optical axis 16 in one plane when the spatial light modulators 18 and 118 are in one plane. In this manner, more than one spatial light modulator can be imaged on the same workpiece positioned within the image plane 27 of the projection optical system 22. In another embodiment, more than one spatial light modulator is imaged on respective workpieces positioned within the image plane 27 of the projection optical system 22.

Figure 12:
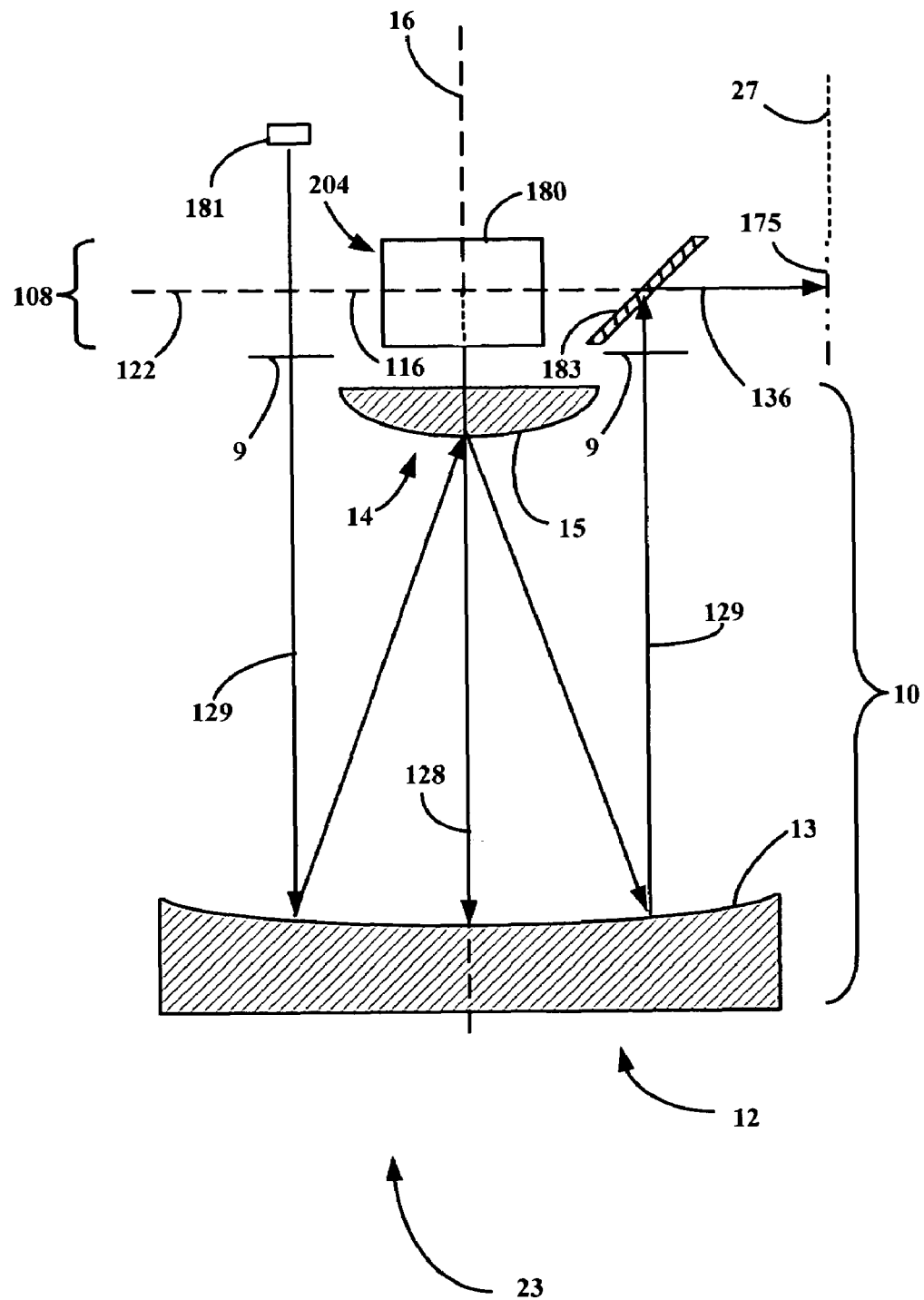

FIGS. 10-12 are, respectively, a top view, a first cross-sectional view and a second cross sectional view of an example of a fourth embodiment of a projection optical system 23 for digital lithography in accordance with the invention. The plane upon which the cross-section view of FIG. 11 is taken is indicated by section line 11-11 in FIG. 10. The plane upon which the cross-section view of FIG. 12 is taken is indicated by section line 12-12 in FIG. 10.

Projection optical system 23 is composed of the Offner imaging system 10 and mirror system 108. The Offner imaging system 10, as described above with reference to FIG. 1, includes a primary mirror 12 and a secondary mirror 14. Mirror system 108 is composed of plane mirrors 182, 183 and 184, which are arranged to direct light from spatial light modulators 180 and 181. The plane mirrors 182, 183 and 184 are positioned in a plane 122, shown in cross-section as line 122 in FIGS. 11 and 12.

The spatial light modulators 180 and 181 emit optical beams 128 having extents that fit within the well-corrected region 9 of the Offner imaging system 10. The spatial light modulators 180 and 181 are positioned in two different planes that are perpendicular to the optical axis 16 and axially offset along the optical axis 16 from one another and from plane 22. The spatial light modulator 180 is offset further from the plane 22 than spatial light modulator 181. Thus, spatial light modulator 180 has a longer image distance and object distance than spatial light modulator 181.

The optical beams 128 and 129 emitted from the spatial light modulators 180 and 181, respectively, are directed toward the primary mirror 12. The optical beams 128 and 129 are partially coherent optical beams 128 and 129. In one embodiment, the optical beams 128 and 129 are non-coherent. In one embodiment, the optical beams 128 and 129 are collimated by a collimators fixed to spatial light modulators 180 and 181 or placed between the spatial light modulators 180 and 181 and Offner imaging system 10.

The projection of spatial light modulator 180 in plane 122 is diametrically opposite mirror 182. Mirror 182 has a width equal to or greater than the width of the spatial light modulator 180. The projection of spatial light modulator 181 in plane 122 is diametrically opposite mirror 183. Mirror 183 has a width equal to or greater than the width of the spatial light modulator 181. FIGS. 10-12 show two spatial light modulators but more than two spatial light modulators can be used in projection optical system 23.

Referring to FIG. 11, the first optical beam 128 is reflected by the primary mirror 12, the secondary mirror 14 and again by primary mirror 12 of Offner imaging system 10 and emerges from Offner imaging system 10 as first optical beam 134. The second reflection by the concave spherical surface 13 of the Offner imaging system 10 directs the first optical beam 134 towards the mirror 182. The first optical beam 128 is reflected at the mirror 182 towards mirror 184 as first output optical beam 134. The first optical beam 134 is reflected at the mirror 184 towards image plane 27 of the projection optical system 23 as first output optical beam 138 (FIG. 10). Image 174 is formed in the image plane 27. The object distance of the spatial light modulator 180 from the Offner imaging system 10 equals the image distance of the image 174 from the Offner imaging system 10.

Referring to FIG. 12, the second optical beam 129 is reflected by the primary mirror 12, the secondary mirror 14 and again by primary mirror 12 of Offner imaging system 10 and emerges from Offner imaging system 10 as second optical beam 129. The second reflection by the concave spherical surface 13 directs the second optical beam 129 towards the mirror 183. The second optical beam 129 is reflected at the mirror 183 towards image plane 27 of the projection optical system 23 as second output optical beam 136. Image 175 is formed in the image plane 27. The object distance of the spatial light modulator 181 from the Offner imaging system 10 equals the image distance of the image 175 from the Offner imaging system 10.

The object distance of the spatial light modulator 180 does not equal the object distance of the spatial light modulator 181 since the optical path of first optical beams 134 and 138 is longer distance than the optical path of second optical beam 136.

If the output optical beams from more than one spatial light modulator is input into the projection optical system 23 to be imaged in one plane 27, then the position of the spatial light modulators will be axially offset along the optical axis 16 from the well-corrected region 9 by a distance that compensates for the difference in optical path length of the output optical beams as is known in the art. In this manner, more than one spatial light modulator is imaged on a flat workpiece positioned within the image plane 27 of the projection optical system 23. The lengths of the spatial light modulators 180 and 181 combined are equal to or longer than the length of a single high aspect ratio spatial light modulator.

In one embodiment the mirror system 108 does not include the mirror 184. In this embodiment, the spatial light modulators 180 and 181 are all in a single plane and the images for the spatial light modulators 180 and 181 are in unique image planes.

While the embodiments of the invention disclosed herein are presently considered to be preferred, various changes and modifications can be made without departing from the scope of the invention. The scope of the invention is indicated in the appended claims and all changes that come within the meaning and range of equivalents are intended to be embraced therein.

We claim:

1. A projection optical system for digital lithography, the system comprising:
    an Offner imaging system defining an optical axis and having a well-corrected region;
    spatial light modulators circumferentially arranged about the optical axis such that optical beams emitted thereby propagate through the Offner imaging system within the well-corrected region; and
    a mirror system, concentric with the optical axis, arranged to direct the optical beams emitted by the spatial light modulators to propagate through the Offner imaging system within the well-corrected region in which the mirror system comprises:
        a frustoconical external reflective surface facing away from the optical axis, concentric with the optical axis and aligned with the well-corrected region; and
        a frustoconical internal reflective surface, facing the optical axis, concentric with the optical axis and further from the optical axis than the frustoconical external reflective surface, the frustoconical internal reflective surface configured to reduce the optical beams in circumferential extent and arranged to direct the reduced-extent optical beams towards the frustoconical external reflective surface.

2. The projection optical system of claim 1, in which the emitted optical beams have extents that fit within the well-corrected region.

3. The projection optical system of claim 1, in which the mirror system comprises pairs of folding mirrors, one of each pair aligned with a respective one of the spatial light modulators and the well-corrected region.

4. The projection optical system of claim 3, in which the mirror system further comprises a turning mirror, the turning mirror and the other one of each pair of folding mirrors locating an image of the spatial light modulator at an image plane.

5. The projection optical system of claim 1, in which one or more spatial light modulators generate the optical beams as partially-coherent beams.

6. The projection optical system of claim 1, in which one or more spatial light modulators generate the optical beams as non-coherent beams.

7. The projection optical system of claim 1, additionally comprising one or more collimators arranged to collimate the optical beams from one or more spatial light modulators.

8. A projection optical system for digital lithography, the system comprising:
    an Offner imaging system defining an optical axis and having a well-corrected region; and
    spatial light modulators circumferentially arranged about the optical axis means for directing optical beams emitted from the spatial light modulators to propagate through the Offner imaging system within the well-corrected region in which the means for directing comprises means for reducing the optical beams in extent, the means for reducing the optical beams in extent comprising a mirror system concentric with the optical axis, in which the mirror system directs the optical beams through the well-corrected region, the mirror system comprising a frustoconical external reflective surface facing away from the optical axis, concentric with the optical axis and aligned with the well-corrected region; and
    a frustoconical internal reflective surface, facing the optical axis, concentric with the optical axis and further from the optical axis than the frustoconical external reflective surface, the frustoconical internal reflective surface configured to reduce the optical beams in circumferential extent and arranged to direct the reduced-extent optical beams towards the frustoconical external reflective surface.

9. The projection optical system of claim 8, in which the emitted optical beams have extents that fit within the well-corrected region.

10. The projection optical system of claim 8, in which the means for directing comprises mirror segments aligned with the spatial light modulators to direct respective optical beams through the well-corrected region.

11. The projection optical system of claim 10, in which the mirror segments comprise:
    pairs of folding mirrors, one of each pair aligned with a respective one of the spatial light modulators and the well-corrected region, in which the pairs of folding mirrors are positioned in a plane perpendicular to the optical axis and offset along the optical axis from the well-corrected region.

12. The projection optical system of claim 11, in which the means for directing further comprises:
    a turning mirror aligned with the other of each pair of folding mirrors to direct respective output beams towards an image plane.

13. The projection optical system of claim 8, in which the emitted optical beams have extents that do not fit within the well-corrected region.

14. The projection optical system of claim 8, in which one or more spatial light modulators generate optical beams as partially-coherent beams.

15. The projection optical system of claim 8, in which one or more spatial light modulators generate optical beams as non-coherent beams.

16. A method of imaging spatial light modulators, the method comprising:

provinding an Offner imaging system defining an optical axis and having a well-corrected region;

arranging spatial light modulators circumferentially about the optical axis; and emitting optical beams from the spatial light modulators, the optical beams having extents that fit within the well-corrected region, so that the emitted optical beams propagate through the Offner imaging system within the well-corrected region directing the optical beams emitted by the spatial light modulators to propagate through a mirror system comprising a frustoconical external reflective surface facing away from the optical axis, concentric with the optical axis and aligned with the well-corrected region and a frustoconical internal reflective surface, facing the optical axis, concentric with the optical axis and further from the optical axis than the frustoconical external reflective surface, the frustoconical internal reflective surface configured to reduce the optical beams in circumferential extent and arranged to direct the reduced-extent optical beams towards the frustoconical external reflective surface.

17. The method of claim 16, additionally comprising:

imaging output optical beams after they propagate through the well-corrected region.

* * * * *